United States Patent [19]

Huynh

[11] Patent Number: 4,595,115
[45] Date of Patent: Jun. 17, 1986

[54] HIDDEN PANEL CONNECTOR

[75] Inventor: Tam H. Huynh, Huntsville, Ala.

[73] Assignee: Intergraph Corporation, Huntsville, Ala.

[21] Appl. No.: 757,259

[22] Filed: Jul. 22, 1985

[51] Int. Cl.⁴ .................. B65D 43/14; B65D 51/04
[52] U.S. Cl. .................................................. 220/337
[58] Field of Search ............... 220/3.8, 337, 335, 338

[56] References Cited

U.S. PATENT DOCUMENTS

| | | |
|---|---|---|
| 638,381 | 12/1899 | Davidson . |
| 2,302,661 | 11/1942 | Benson ................ 220/337 |
| 2,971,805 | 2/1961 | Weiss . |
| 3,663,990 | 5/1972 | Shane ................. 220/337 |
| 3,727,110 | 4/1973 | Spoko, Jr. et al. . |
| 3,781,460 | 12/1973 | Westergren et al. . |
| 3,860,309 | 1/1975 | Brendgord . |
| 4,015,886 | 4/1977 | Wickenberg . |
| 4,061,228 | 12/1977 | Johnson . |
| 4,282,983 | 8/1981 | Swartzbaugh ........ 220/335 |
| 4,406,379 | 9/1983 | Anderson et al. ..... 220/337 |

Primary Examiner—George T. Hall
Attorney, Agent, or Firm—Cushman, Darby & Cushman

[57] ABSTRACT

A hidden panel connector for an electronics enclosure having a removable cover member and a fixed cover member. The fixed cover member is provided with a curved member which projects from the fixed cover member and curves in an upward direction. The removable cover member is provided with a cam member which slideably engages the curved portion so that the removable cover member is vertically rotatable about the fixed cover member. Each cover member has a periphery with lips disposed thereon, which lips engage one another to provide additional stability. Each of the cover members also includes an interlocking member. The interlocking members are engageable with one another to prevent the removable cover member from being vertically displaced from the fixed cover member. The curved cam and interlocking members are integral with and disposed on the inside walls of the fixed and removable cover members to provide a connector hidden on the inside of the electronic enclosure.

17 Claims, 3 Drawing Figures

HIDDEN PANEL CONNECTOR

BACKGROUND OF THE INVENTION

1. Field of the Invention

This invention relates to the field of panel connectors and more specifically to the field of hidden connectors for electronic enclosures.

2. Description of the Prior Art

With the increasing use of electronic components in our society, greater numbers of electronic enclosures are making their appearance in a variety of places. These electronic enclosures must be constructed so that the enclosure is easily opened to provide access to the electronics within. Such enclosures must also be provided with connectors which are easy to operate and inexpensive to manufacture.

Devices are known for connecting two halves of an electronic enclosure so as to allow access to the inside of the enclosure. Typically, the halves are connected by screws which are externally visible. Alternatively, hinges, locking pins, latches, and various other fixing means may be employed. Screws detract from the external appearance of the enclosure. Furthermore, the alternative fixing means often require special tools and/or special knowledge in order to allow access to the inside of the enclosure. Also, they must be attached to the electronic enclosure in a separate manufacturing step. Another disadvantage of such connectors is that they usually increase the time and expense of manufacturing the enclosure. Finally, they often protrude from the enclosure thus requiring additional space and creating a safety risk.

Therefore, no known electronic enclosures include panel connectors which are hidden, simple to operate, inexpensive to manufacture, and easy to assemble.

SUMMARY OF THE INVENTION

The present invention overcomes these problems by providing an electronic enclosure connector which may be easily opened and closed without special tools or special knowledge. The connector according to the present invention is also hidden inside the enclosure and is inexpensive to produce and assemble.

In the preferred embodiment, a connector is provided for connecting first and second panels of an electronic enclosure in which at least one curved member is integral with the first panel and projects from the first panel and curves in an upward direction. At least one cam member is provided integral with the second panel and mounted so as to be engageable with the curved member of the first panel. The curved and cam members are so engaged as to cause the first and second panel to be connected with a positive closing force. The electronic enclosure may also include lips on both panels which engage each other to provide greater stability when the enclosure is closed. Interlocking members may also be provided to prevent vertical movement of the first panel with respect to the second panel when the enclosure is closed.

BRIEF DESCRIPTION OF THE DRAWINGS

These and other objects and advantages of the present invention will become readily apparent and more easily understood from the following detailed description of the presently preferred exemplary embodiment of the invention considered in conjunction with the accompanying drawings, of which.

DETAILED DESCRIPTION OF THE PRESENTLY PREFERRED EXEMPLARY EMBODIMENT

Figure 1:
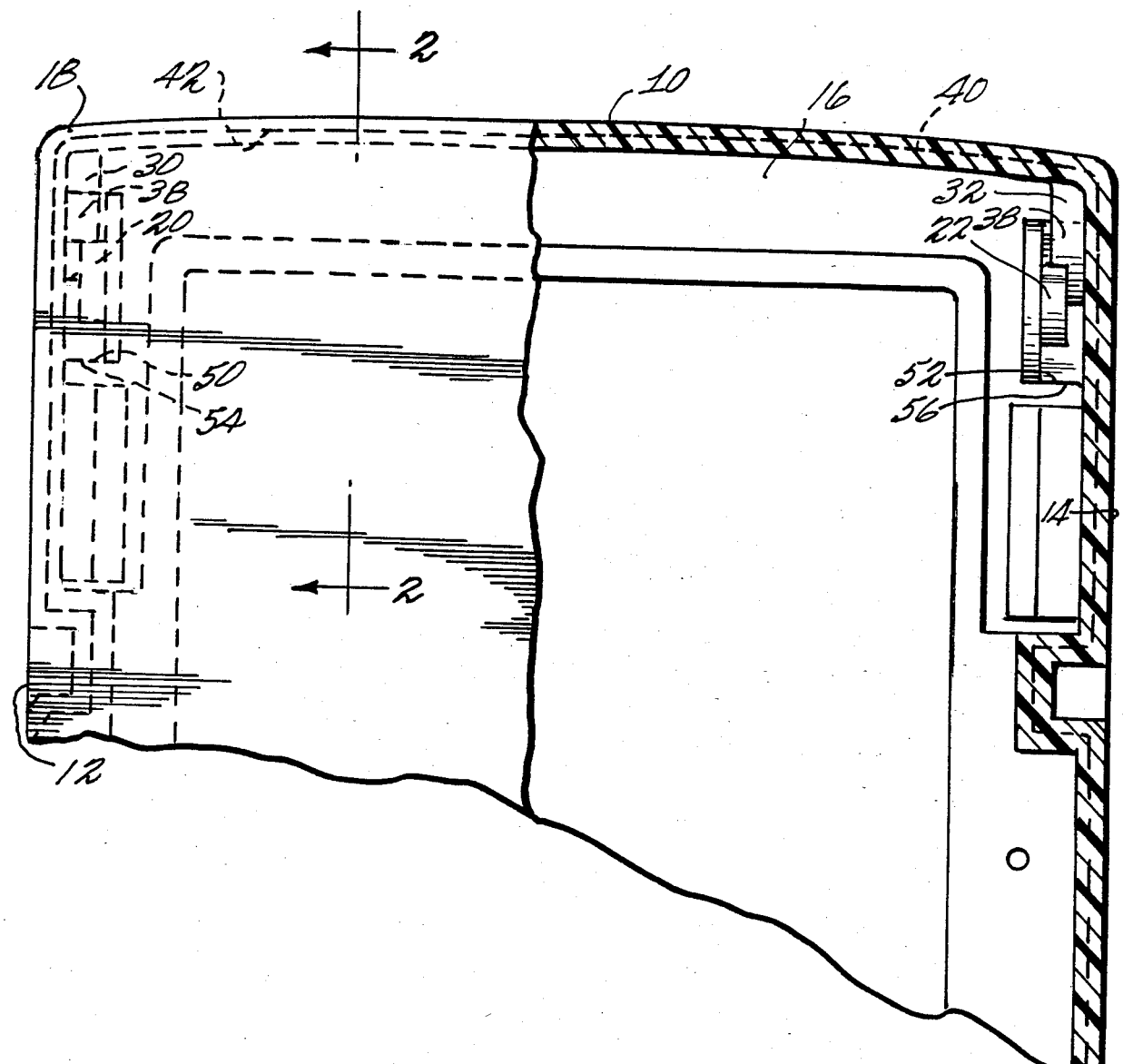
FIG. 1 is a side elevational view of an electronic enclosure incorporating hidden connectors according to the preferred embodiment of the present invention, partially in section.
Figure 2:
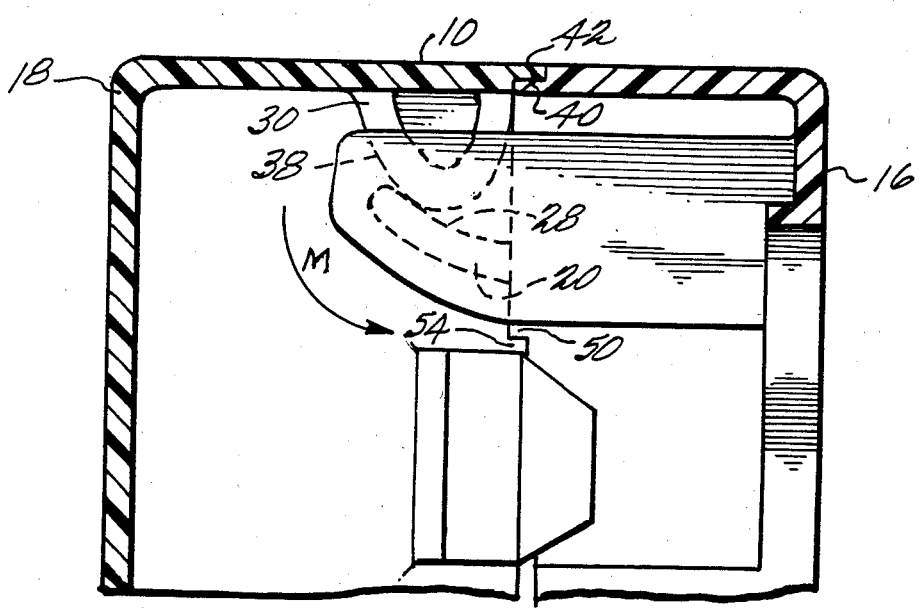
FIG. 2 is an enlarged sectional view taken along line 2—2 of FIG. 1.
Figure 3:
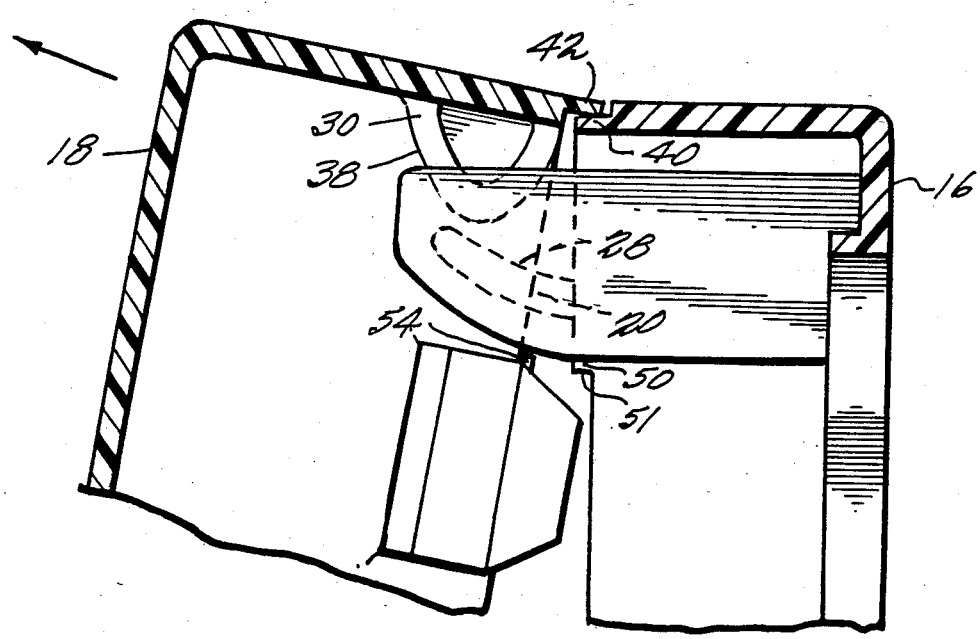
FIG. 3 is a view similar to FIG. 2 but showing the panels rotated apart to provide a more detailed view of a hidden connector according to the present invention.

Referring to FIGS. 1-3, it can be seen that the electronic enclosure is substantially rectangular and includes a fixed cover member 16 and a removable cover member 18. A hidden panel connector according to the present invention is disposed on each opposite side 12 and 14 of the enclosure, to interconnect removable cover member 18 and fixed cover member 16. This arrangement provides stability to the enclosure and allows enclosure portions 16 and 18 to be firmly interconnected at each side thereof.

As part of the hidden connectors, fixed cover member 16 includes two curved members 20 and 22 which extend perpendicular from fixed cover member 16 (outward from the plane of the drawing) and curve in a direction toward top 10 of the enclosure (as best shown in FIGS. 2 and 3). Curved members 20 and 22 are integral with the inside walls of fixed cover member 16.

Removable cover member 18 includes two cam members 30 and 32 which may slideably engage curved members 20 and 22, respectively (as illustrated in FIG. 2). Cam members 30 and 32 are also integral with the inside walls of removable cover member 18.

Curved member 20 has an inside curved surface 28 which engages an outside curved surface 38 of cam member 30. It can be appreciated that curved surfaces 28 and 38 are slideably engaged to allow movement of the cover members with respect to each other. In operation, the enclosure may be opened by rotating removable cover member 18 upward about an axis which is parallel to top 10 of the enclosure until cam members 30 and 32 are no longer engaged with curved members 20 and 22 (as illustrated in FIG. 3). Removable cover member 18 can then be easily separated from fixed cover member 16 to allow access to the inside of the enclosure.

By providing upwardly curving members 20 and 22 and engageable cam members 30 and 32, the present invention allows removable cover member 18 to be stably and firmly connected to fixed cover member 16 when the enclosure is closed. This is because the weight of removable cover member 18 is supported by upwardly curved members 20 and 22, providing a moment about curved members 20 and 22. This moment provides a horizontal closing force (into the plane of FIG. 1) to ensure that the enclosure is kept firmly closed. By the same token, this moment provides a vertically downward force (downward in the plane of FIG. 1) which also provides a firm closure of removable cover member 18 to fixed cover member 16.

To provide additional stability to the enclosure, each of fixed cover member 16 and removable cover member 18 is provided with a lip disposed about the periphery of each member. Thus, fixed cover member 16 has a lip 40 disposed about the periphery thereof. Likewise, removable cover member 18 has a lip 42 disposed about its periphery. When the enclosure is closed (as illustrated in FIG. 2), lips 40 and 42 will engage one another to provide additional stability and to prevent horizontal movement of one cover member with respect to the other.

The present invention also includes an interlocking feature by which removable cover member 18 may be prevented from being displaced vertically upward with respect to fixed cover member 16. This interlocking feature is accomplished by interlocking members 50 and 52 which are provided on opposite sides of fixed cover member 16 and slightly below the curved members 20 and 22. Removable cover member 18 is provided with interlocking members 54 and 56, also disposed on opposite sides of the cover member. Interlocking members 50 and 52 are engageable with interlocking members 54 and 56, respectively, to prevent the upward movement of removable cover member 18 when the enclosure is closed (as illustrated in FIG. 2).

According to the present embodiment, each interlocking member 50-54 includes a horizontal edge. For example, interlocking member 50 of fixed cover member 16 has horizontal edge 51 facing in a downward direction (see FIG. 3). Edge 51 abuts against an upward-facing horizontal edge 55 of interlocking member 54 associated with removable cover member 18. Thus, interlocking edges are provided to prevent vertical shifting of removable cover member 18 with respect to fixed cover member 16.

To disengage this interlocking feature, removable cover member 18 must be rotated open a sufficient distance (approximately 15°) to allow interlocking members 54 and 56 to become disengaged from members 50 and 52 (as illustrated in FIG. 3). Then, removable cover member 18 may be separated from fixed cover member 16 to provide access to the interior of the electronic enclosure.

In the preferred embodiment of the present invention, the enclosure and all described members are constructed of plastic. Therefore, manufacturing will be easy and no additional steps will be required to assemble fixing devices on the enclosure.

Thus, what has been described is a hidden panel connector for an electronic enclosure which is inexpensive to manufacture, easy to assemble, and simple to operate.

While the invention has been described in connection with what is presently considered to be the most practical and preferred embodiments, it is understood that the invention is not to be limited to the disclosed embodiment but, on the contrary, is intended to cover various modifications and equivalent arrangements included within the spirit and scope of the appended claims, which scope is to be accorded the broadest interpretation so as to encompass all such modifications and equivalent structures.

What is claimed is:

1. Apparatus for connecting first and second panels, comprising:
   at least one curved member integral with and projecting from said first panel and curving in a first direction; and
   at least one cam member integral with said second panel and engageable with said curved member to cause said first and second panel to be connected.

2. Apparatus according to claim 1 wherein said curved member has an inside curved surface facing in said first direction, and wherein said cam member has an outside curved surface facing in a second direction opposite said first direction, said outside curved surface being slideably engageable with said inside curved surface to allow said second panel to be rotatable about said first panel in said first direction.

3. Apparatus according to claim 1 wherein said first panel has a first lip, and said second panel has a second lip which is engageable with said first lip to cause said panels to be stably connected.

4. Apparatus according to claim 1 wherein said first panel has a first horizontal edge and said second panel has a second horizontal edge which abuts said first horizontal edge to cause said panels to be interlocked in said first direction when said panels are substantially connected.

5. Apparatus for connecting first and second vertical panels, comprising:
   at least one curved member integral with and projecting from said first panel and curving in an upward direction;
   at least one cam member integral with said second panel and engageable with said curved member to cause said panels to be connected;
   a first horizontal edge integral with said first panel; and
   a second horizontal edge integral with said second panel and engageable with said first horizontal edge to prevent said second panel from being upwardly displaced when said panels are substantially connected.

6. Apparatus according to claim 5 wherein said curved member has an inside curved surface which faces upward, and said cam member has an outside curved surface which faces downward and which is slideably engageable with said inside curved surface to allow said second panel to be vertically rotatable about said first panel.

7. Apparatus according to claim 6 wherein said first panel has a periphery with a first lip integral therewith, and wherein said second panel has a periphery with a second lip integral therewith, said second lip being engageable with said first lip.

8. Apparatus according to claim 7 wherein said first panel is a fixed cover member having a first inside wall, and said second panel is a removable cover member having a second inside wall, said curved member projecting from said first inside wall toward said removable cover member, said cam member being integral with said second inside wall.

9. Apparatus according to claim 8 wherein said first and second lips and said first and second horizontal edges are respectively engaged when said fixed and removable cover members are substantially connected.

10. Apparatus according to claim 9 wherein said at least one curved member includes first and second curved members and said at least one cam member includes first and second cam members, said first and second curved members being engageable with said first and second cam members, respectively.

11. Apparatus according to claim 10 wherein said fixed and removable cover members form a substantially rectangular enclosure with said first curved member and said first cam member mounted on an opposite side of said enclosure from said second curved member and said second cam member.

12. Apparatus according to claim 11 wherein said fixed cover member has a rectangular shape with a top and said removable cover member is rotatable about a horizontal axis parallel to said lip on said top.

13. Apparatus according to claim 12 wherein said fixed cover member includes first and third horizontal edges disposed on opposite sides of said enclosure, and said removable member includes second and fourth horizontal edges disposed on opposite sides of said enclosure so as to be engageable with said first and third horizontal edges respectively.

14. An enclosure, comprising:
a first cover member having at least one curved member extending therefrom and curving in an upward direction, said curved member having an inside curved surface facing upward, said first cover member having a periphery with a first lip disposed thereon, and at least one first interlocking member; and
a second cover member having at least one cam member with an outside curved surface which is slideably engageable with said inside curved surface to cause said second cover member to be vertically rotatable about said first cover member, said second cover member having a periphery with a second lip disposed thereon which is engageable with said first lip, and at least one second interlocking member which is engageable with said first interlocking member when said first and second cover members are substantially closed with respect to each other.

15. Apparatus according to claim 14 wherein said first and second cover members each have an inside wall with said curved member extending from said first cover member inside wall, and said cam member being mounted on said second cover member inside wall.

16. Apparatus according to claim 15 wherein said first and second cover members each have a rectangular shape with parallel opposite sides and a top, and wherein said first cover member includes first and second curved members and first and third interlocking members mounted on inside walls of said opposite sides, and said second cover member includes first and second cam members and second and fourth interlocking members mounted on inside walls of said opposite sides so as to be engageable with said first and second curved members and said first and third interlocking members respectively.

17. Apparatus according to claim 16 wherein said second cover member is rotatable about an axis parallel to said first cover member top.

* * * * *